(12) United States Patent
Kang

(10) Patent No.: US 6,661,698 B1
(45) Date of Patent: Dec. 9, 2003

(54) NONVOLATILE FERROELECTRIC MEMORY CONTROL DEVICE

(75) Inventor: Hee Bok Kang, Daejeon (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/330,062

(22) Filed: Dec. 30, 2002

(30) Foreign Application Priority Data

Aug. 30, 2002 (KR) ........................................ 2002-51936

(51) Int. Cl.$^7$ ............................................. G11C 11/22
(52) U.S. Cl. ............. 365/145; 365/185.08; 365/230.08; 365/233.5
(58) Field of Search ........................... 365/145, 230.06, 365/230.08, 233.5, 185.08

(56) References Cited

U.S. PATENT DOCUMENTS 6,385,078 B2 * 5/2002 Jeon ........................... 365/145

* cited by examiner

Primary Examiner—Tan Nguyen
(74) Attorney, Agent, or Firm—Jacobson Holman PLLC

(57) ABSTRACT

The present invention generally relates to nonvolatile ferroelectric memory control devices, and more specifically, to a nonvolatile ferroelectric memory control device suitable for an embedded memory. In the nonvolatile ferroelectric memory control device of the present invention, a column address area is arranged in the least significant bit region. When a column address is accessed in the same row address, an address transition detecting signal is not generated. According to the present invention, an internal data register array is arranged and a repeated access address controls the data register array so that data stored in the register may be immediately outputted. Accordingly, the nonvolatile ferroelectric memory control device of the present invention can reduce power consumption when the FRAM is used as a program memory in a SOC (System on Chip) structure and extends life of FRAM by decreasing power stress applied to cells.

25 Claims, 11 Drawing Sheets

NONVOLATILE FERROELECTRIC MEMORY CONTROL DEVICE

BACKGROUND OF THE INVENTION

1. Field of the Invention

The present invention generally relates to nonvolatile ferroelectric memory control devices, and more specifically, to a nonvolatile ferroelectric memory control device suitable for an embedded memory when the FRAM is used as a program memory in a SOC (System on Chip) structure.

2. Description of the Prior Art

Generally, a ferroelectric randaom access memory (hereinafter, referred to as 'FeRAM') has attracted considerable attention as next generation memory device because it has a data processing speed as fast as a Dynamic Random Access Memory DRAM and conserves data even after the power is turned off.

The FRAM has structures similar to the DRAM, but does not have the capacitors made of a ferroelectric substance. The FRAM utilizes the characteristic of a high residual polarization of the ferroelectric substance in which data is not low even after eliminating an electric field applied thereto.

FIG. 1 is a characteristic curve illustrating a hysteresis loop of a general ferroelectric substance.

A polarization induced by an electric field does not vanish but remains at a certain portion ('d' or 'a' state) because of existence of a residual (or spontaneous) polarization even after the electric field is cleared. The FeRAM cell can be used as a memory device since the 'd' and 'a' states may be matched to binary values of '1' and '0', respectively.

FIG. 2 is a structural diagram illustrating a unit cell of the FRAM device.

The unit cell of the conventional FRAM is provided with a bitline BL arranged in one direction and a wordline WL arranged in another direction vertical to the bitline BL. A plateline PL is arranged parallel to the wordline WL and spaced at a predetermined interval.

The unit cell is also provided with a transistor T1 having a gate connected to an adjacent wordline WL and a source connected to an adjacent bitline BL. And a ferroelectric capacitor FC1 is connected between the drain terminal of the transistor T1 and the plateline PL.

The data input/output operation of the conventional FRAM is now described referring to FIGS. 3a and 3b.

FIG. 3a is a timing diagram illustrating a write mode of the FRAM.

When entered into an active period, a chip enable signal CSB applied externally transits from a high to low level and simultaneously a write enable signal also transits from a high to low level, and then the array is enabled to start a write mode. Thereafter, if an address is decoded in a write mode, a wordline corresponding to the decoded address transits from a "low" to "high" level, thereby selecting the cell.

In the interval where the wordline WL is held at a high level, a high signal of a predetermined interval and a low signal of a predetermined interval are sequentially applied to a corresponding plateline PL. In order to write binary logic values '1' or '0' in the selected cell, 'high' or 'low' signals synchronized in the write enable signal are applied to a corresponding bitline BL. Here, a sense amplifier enable signal SEN is maintained at a high level.

In other words, when a high signal is applied to a bitline BL and a low signal is applied to a plateline PL, a logic value "1" is written as an input data DIN in the ferroelectric capacitor FC1. When a low signal is applied to a bitline BL and a high signal is applied to,a plateline PL, a logic value "0" is written as an input data DIN in the ferroelectric capacitor FC1.

FIG. 3b is a timing diagram illustrating a read mode of the FRAM.

When entered into an active period, a chip enable signal CSBpad externally transits from a "high" to "low" level, all bitlines are equalized to a "low" level by an equalization signal before selection of a required wordline WL.

After each bitline becomes inactive and an address is decoded. The wordline WL corresponding to the decoded address is transited from a "low" to "high" level, thereby selecting a corresponding unit cell. A "high" signal is applied to a plateline PL of the selected cell to destroy a data Qs corresponding to the logic value "1" stored in the FeRAM. If the logic value "0" is stored in the FeRAM, its corresponding data Qns will not be destroyed.

In this way, the destroyed and non-destroyed data are outputted as different values, respectively, according to the above-described hysteresis loop characteristics. As a result, a sense amplifier senses logic values "1" or "0".

In other words, as shown in the hysteresis loop of FIG. 1, the state moves from the 'd' to 'f' when the data is destroyed while the state moves from 'a' to 'f' when the data is not destroyed. As a result, if the sense amplifier is enabled by the sense amplifier enable signal SEN after the lapse of a predetermined time, the sense amplifier outputs a logic value "1" as an output data DOUT in case the data is destroyed. While sense amplifier outputs a logic value "0" as an output data DOUT in case the data is not destroyed.

After the sense amplifier amplifies the data, the data should be recovered into the original data. Accordingly, the plateline PL becomes inactive from "high" to "low" at the state whereby a 'high' signal is applied to the required wordline WL.

However, a method for improving reliability has been required when the conventional FeRAM is used in System On a Chip SOC or a Stand Alone. Specifically, when voltages are frequently applied to the FeRAM cell, power consumption is increased and the reliability is degraded. Accordingly, the frequency of cell operations is required to decrease.

Additionally, in the conventional FeRAM, when addresses of cells are assigned, row/column addresses are allotted at random. As a result, power consumption is increased in cell operation of the FeRAM, and life of the cell is reduced due to the unnecessary operation applying stress to the cell.

SUMMARY OF THE INVENTION

Accordingly, it is an object of the present invention to assign column addresses having high driving probability in the least significant bit area. Also, another object of the present invention is not to generate an address transition detecting signal for the column addresses after the first accessed column address when one or more of the column addresses are sequentially accessed in the same row address.

It is another object of the present invention to comprise a data register array for storing data corresponding to the previous address, so that the data stored in the register may be immediately outputted without driving a chip when the address is repeatedly accessed.

In order to achieve the above-described objects, there is a nonvolatile ferroelectric memory control device comprising: a column address latch for latching column addresses according to a chip enable signals; a column decoder for decoding the latched column addresses; a row address latch for latching row addresses according to the chip enable signals; and a chip control signal generator for outputting control signals for controlling chip operation according to address transition detecting signals generated when the latched row address is transited.

DETAILED DESCRIPTION OF THE PREFERRED EMBODIMENTS

The disclosed nonvolatile ferroelectric memory control device will be described referring to the accompanying drawings.

Figure 1:
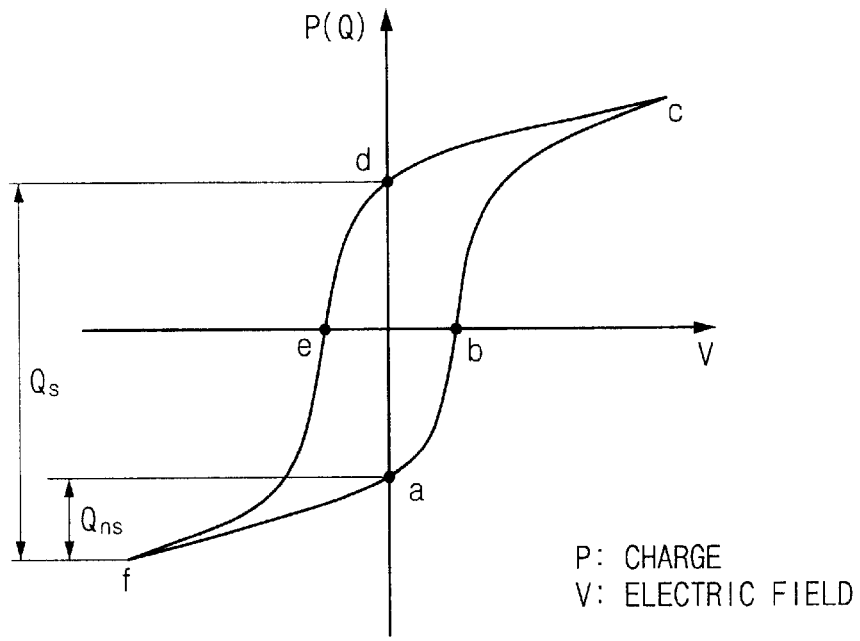
FIG. 1 is a characteristic curve showing a hysteresis loop of a general ferroelectric substance.
Figure 2:
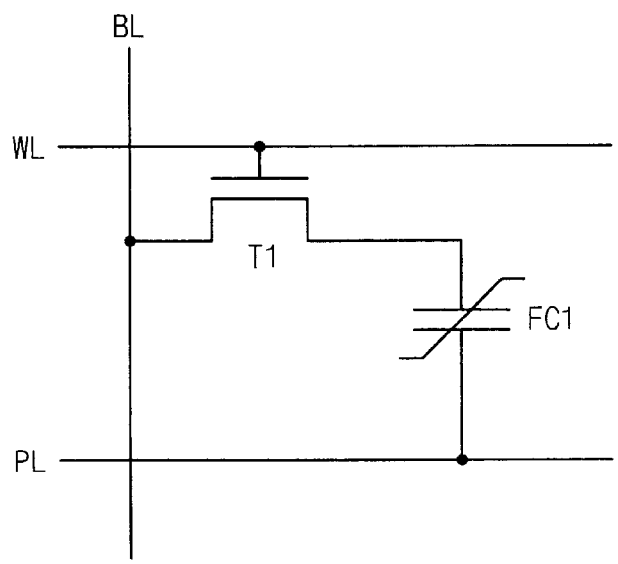
FIG. 2 is a structural diagram showing a unit cell in a conventional nonvolatile ferroelectric memory device.
Figure 3A:
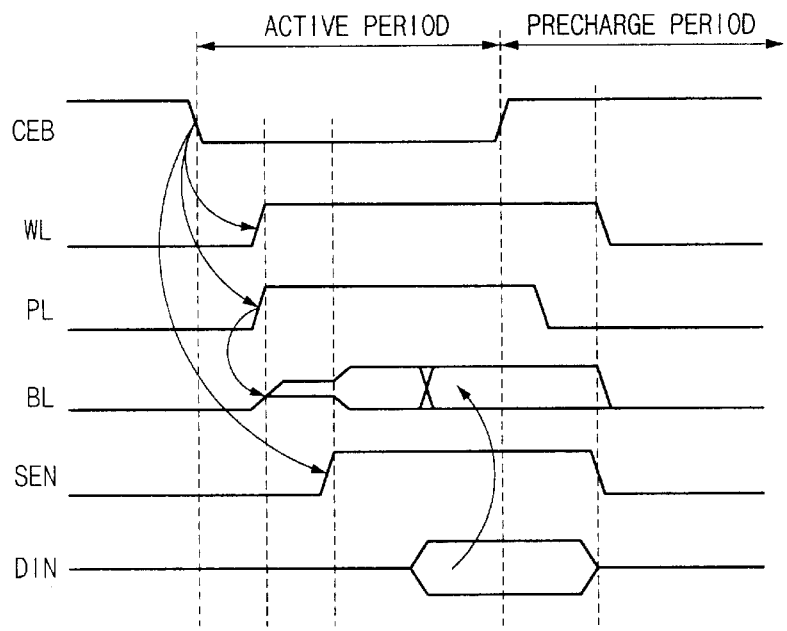
FIG. 3a is a timing diagram showing a write mode operation of a conventional nonvolatile ferroelectric memory device.
Figure 3B:
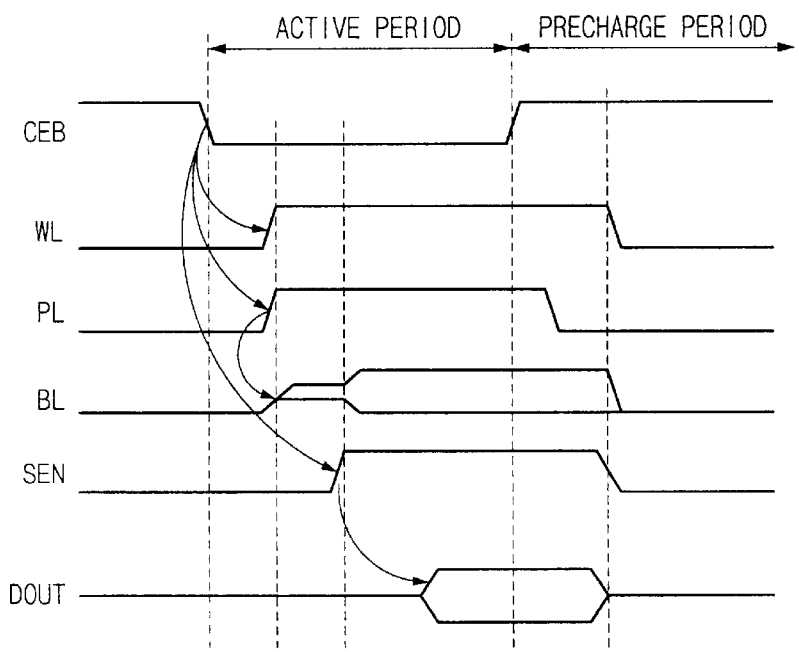
FIG. 3b is a timing diagram showing a read mode operation of a conventional nonvolatile ferroelectric memory device.
Figure 4:
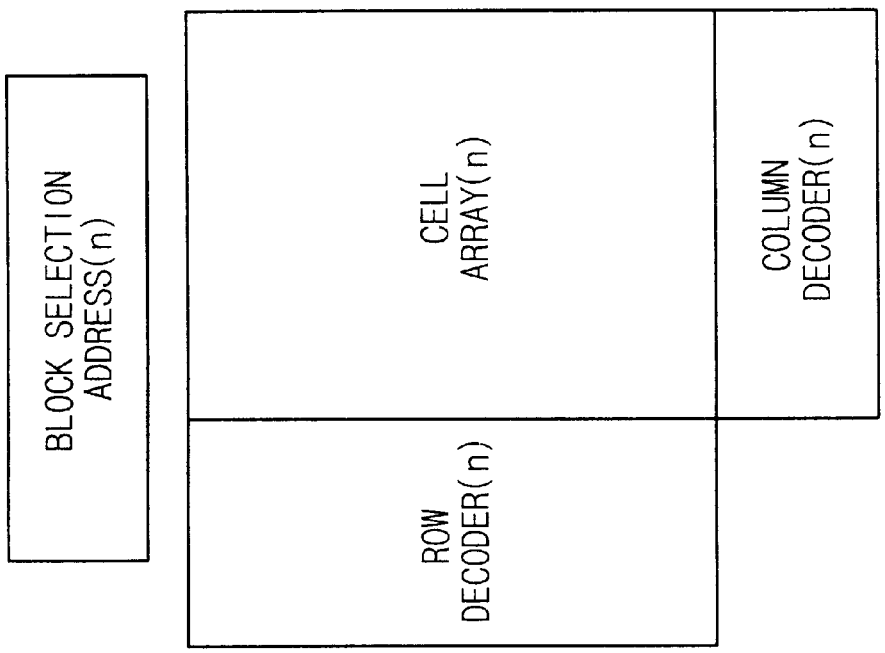
FIG. 4 is a block diagram showing a cell array of a nonvolatile ferroelectric memory control device according to the present invention.
Figure 4:
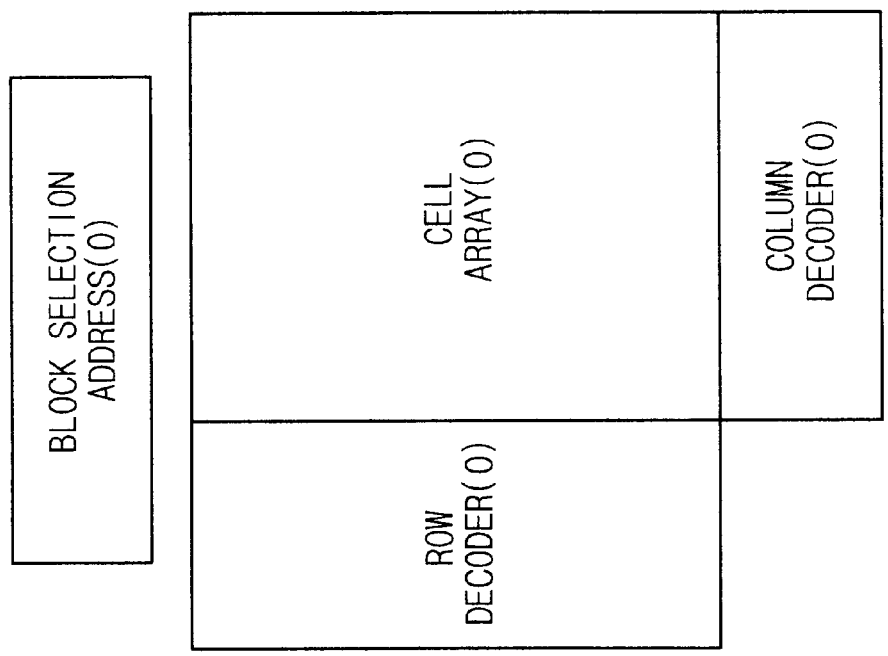

FIG. 4 is a block diagram showing a cell array of a nonvolatile ferroelectric memory control device according to the present invention.

The cell array block comprises a plurality of cell arrays. Each cell array comprises a row decoder for selecting a wordline and a column decoder for selecting a bitline. A block selection address selects at least one among the plurality of cell arrays.

Figure 5:
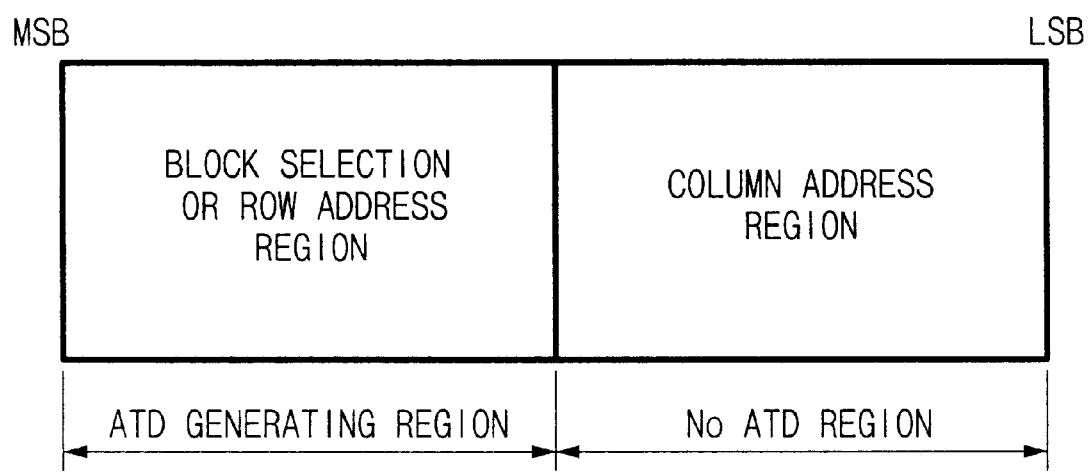
FIG. 5 is a diagram showing address area allotment of a nonvolatile ferroelectric memory control device according to the present invention.

FIG. 5 is a diagram showing allotment of address areas in a nonvolatile ferroelectric memory control device according to the present invention.

A column address region is allotted to the least significant bit LSB area. An address transition detecting signal ATD is not generated in the column address region. As a result, when another column address is again accessed in the same row address, data stored in a sense amplifier is immediately generated without driving a FeRAM cell.

On the other hand, block selection address or row address regions are allotted to the most significant bit MSB area. Whenever a block selection address or a row address is changed, the address transition detecting signal ATD is generated to drive a FeRAM cell normally.

Figure 6:
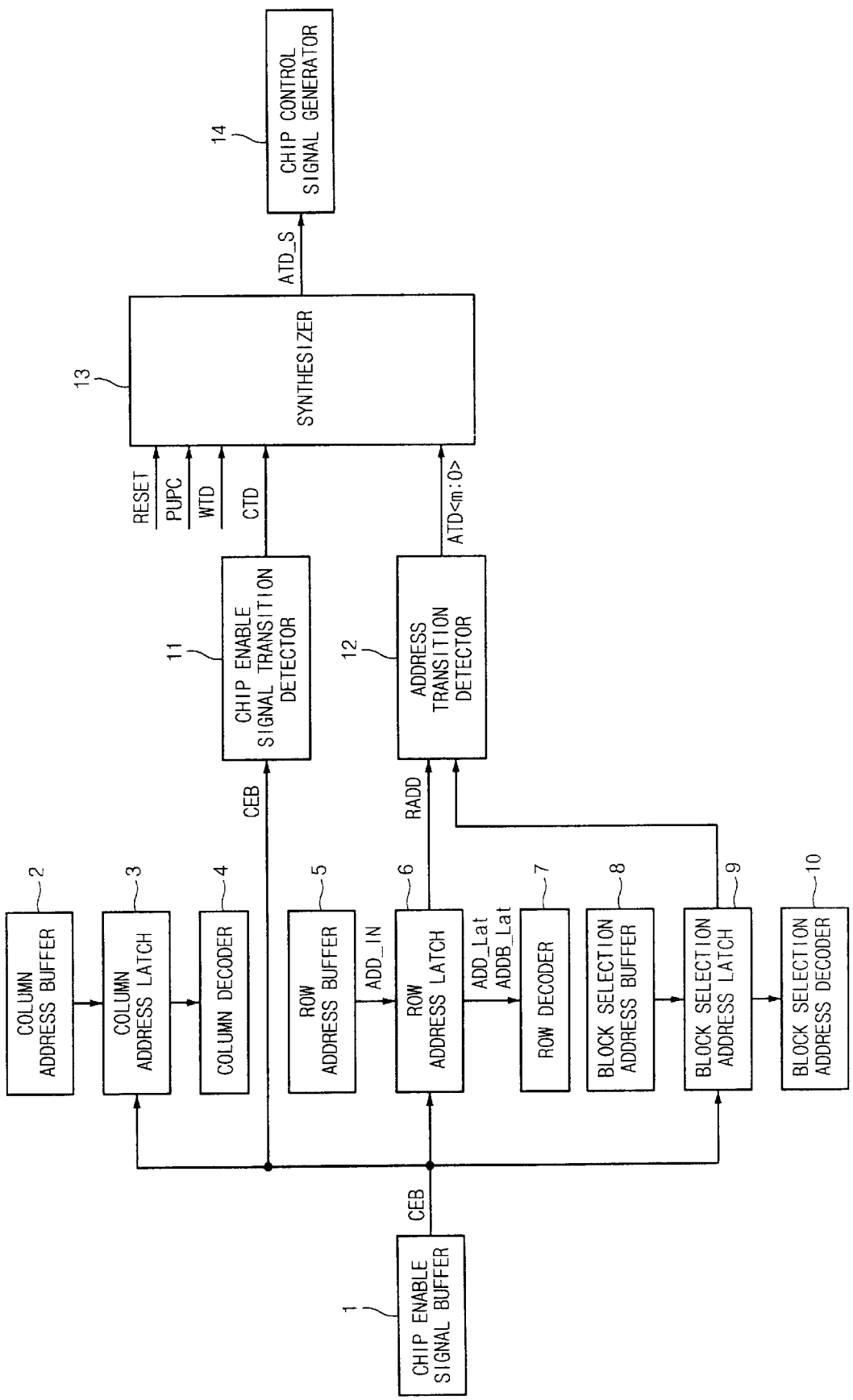
FIG. 6 is a structural diagram showing a nonvolatile ferroelectric memory control device in accordance with a preferred embodiment of the present invention.

FIG. 6 is a structural diagram showing a nonvolatile ferroelectric memory control device in accordance with a preferred embodiment of the present invention.

For a column address path, the nonvolatile ferroelectric memory control device comprises a chip enable signal buffer 1, a column address buffer 2, a column address latch 3 and a column decoder 4.

The chip enable signal buffer 1 buffers a chip enable signal CEB applied externally. The column address latch 3 latches a column address applied from the column address buffer 2 according to the chip enable signal CEB. The column decoder 4 decodes the latched column address by the column address latch 3.

In the present invention, it is not detected whether the latched column address is transited.

For a row address path, the nonvolatile ferroelectric memory device comprises a chip enable signal buffer 1, a row address buffer 5, a row address latch 6, a row decoder 7, a chip enable signal transition detector 11, an address transition detector 12, a synthesizer 13 and a chip control signal generator 14.

The chip enable signal buffer 1 buffers a chip enable signal CEB applied externally. The row address latch 6 latches a row address ADD_IN applied from the row address buffer 5 according to the chip enable signal CEB. And the row address latch 6 outputs a latched row address RADD and latch signals ADD_Lat and ADDB_Lat.

The chip enable signal transition detector 11 detects whether the chip enable signal CEB is transited, and then outputs a chip enable transition detecting signal CTD at a low edge of the chip enable signal CEB.

The address transition detector 12 detects whether the latched row address PADD is transited, and then outputs an address transition detecting signal ATD<m:0>.

In other words, the address transition detector 12 compares the row address RADD with the previously stored row address, and then generates an address transition detecting signal ATD<m:0> when the both row addresses are different but does not generate the address transition detecting signal ATD<m:0> when both row addresses are identical.

The row decoder 7 decodes a row address according to the latch signals ADD_Lat and ADDB_Lat applied from the row address latch 6.

The synthesizer 13 synthesizes the chip enable transition detecting signal CTD with the address transition detecting signal ATD<m:0>, according to power-on reset signal RESET, pull-up control signal PUPC and write enable transition detecting signal WTD, and then outputs a transition synthesizing signal ATD_S.

According to the operation of the synthesizer 13, a chip enable transition detecting signal CTD first generated after the power-on reset signal RESET may affect generation of transition synthesizing signal ATD_S, but the chip enable transition detecting signal CTD generated thereafter may not affect generation of the transition synthesizing signal ATD_S.

The chip control signal generator 14 selectively outputs a chip control signal for driving a chip according to the transition synthesizing signal ATD_S applied from the synthesizer 13.

For a block selection address path, the nonvolatile ferroelectric memory device comprises a chip enable signal buffer 1, a block selection address buffer 8, a block selection address latch 9, a block selection address decoder 10, a chip enable signal transition detector 11, an address transition detector 12, a synthesizer 13 and a chip control signal generator 14.

The chip enable signal buffer 1 buffers a chip enable signal CEB applied externally. The block selection address latch 9 latches a column address applied from the block selection address buffer 8 according to the chip enable signal CEB. The block selection address decoder 10 decodes a block selection address applied from the block selection address latch 9.

The explanation is omitted because the operations of the rest components are identical with those of the row address path.

Figure 7:
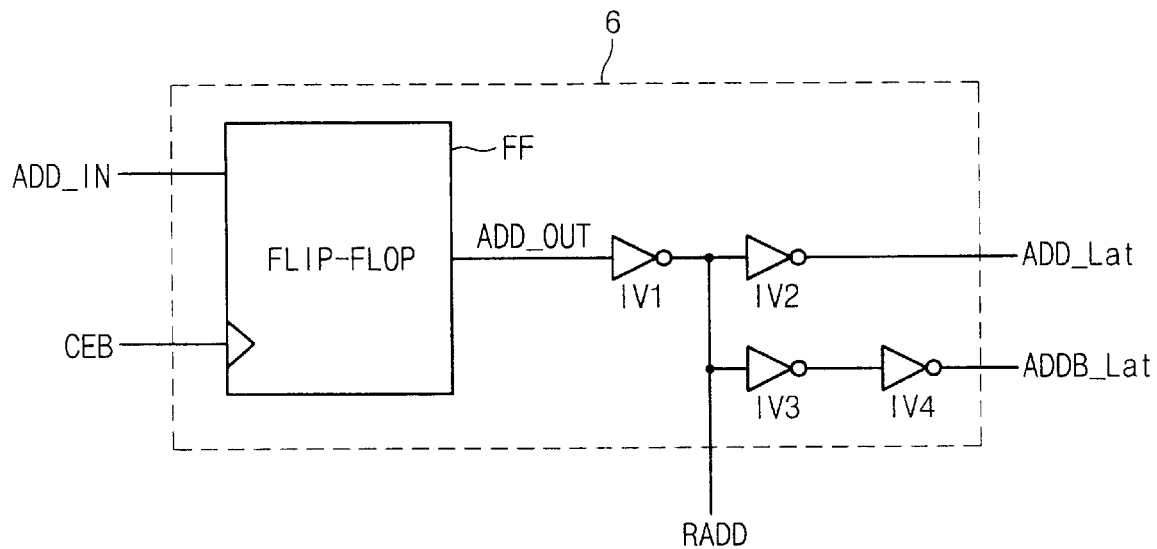
FIG. 7 is a detail structural diagram showing a row address latch of FIG. 6.

FIG. 7 is a detail structural diagram showing the row address latch 6 of FIG. 6.

The row address latch 6 comprises a low-edge triggered flip-flop FF. The flip-flop FF latches a row address ADD_IN triggered at a low edge of the chip enable signal CEB and inputted from the row address buffer 5, and then outputs an output signal ADD_OUT.

An inverter IV1 inverts the output signal ADD_OUT of the flip-flop FF and then outputs a latched row address RADD. Inverters IV1 and IV2 delay and logically non-invert the output signal ADD_OUT of the flip-flop FF, and then outputs a latch signal ADD_Lat. Inverters IV3 and IV4 delay and logically non-invert a row address RADD, a signal outputted from the inverter IV1, and the outputs a latch signal ADDB_Lat.

Figure 8:
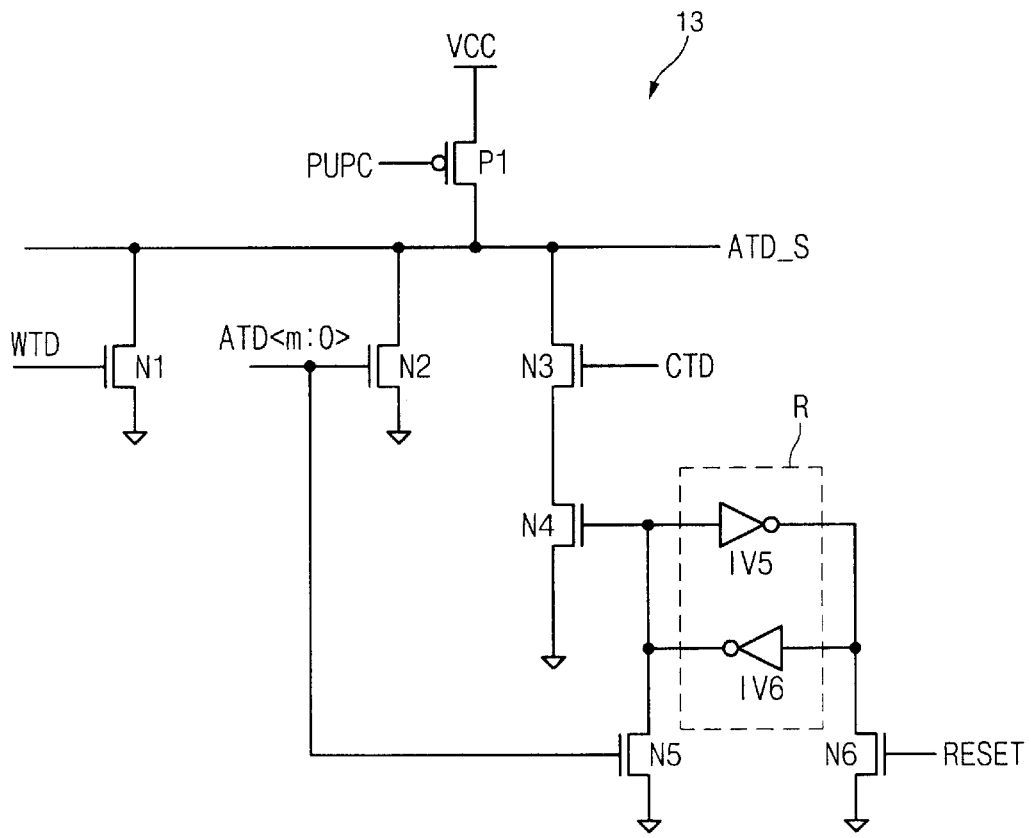
FIG. 8 is a detail circuit diagram showing a synthesizer of FIG. 6.

FIG. 8 is a detail circuit diagram showing the synthesizer 13 of FIG. 6.

A PMOS transistor P1 connected between a power voltage VCC terminal and an output terminal of the transition synthesizing signal ATD_S has a gate whereto a pull-up control signal PUPC is applied.

A NMOS transistor N1 connected between an output terminal of the transition synthesizing signal ATD_S and a ground voltage terminal has a gate whereto a write enable transition detecting signal WTD is applied. A NMOS transistor N2 connected between an output terminal of the transition synthesizing signal ATD_S and the ground voltage terminal has a gate whereto an address transition detecting signal ATD<m:0> is applied.

A NMOS transistor N3 connected between an output terminal of the transition synthesizing signal ATD_S and a drain of the NMOS transistor N4 has a gate whereto a chip enable transition detecting signal CTD is applied. A NMOS transistor N4 connected between the NMOS transistor N3 and the ground voltage terminal has a gate whereto an output signal of an inverter I6 is applied.

A NMOS transistor N5 connected between the gate of the NMOS transistor N4 and the ground voltage terminal has a gate whereto an address transition detecting signal ATD<m:0> is applied. A latch R comprising inverters IV5 and IV6 latches a power-on reset signal RESET inputted from a NMOS transistor N6. A signal outputted from the inverter IV5 is inputted into the inverter IV6, and a signal outputted from the inverter IV6 is inputted into the inverter IV6.

The NMOS transistor N6 connected between the latch R and the ground voltage terminal has a gate whereto a power-on reset signal RESET is applied.

The operation of the synthesizer 13 having the above-described structure is now described.

First, when the power-on reset signal RESET is enabled to a high level, the NMOS transistor N6 is turned-on and then a low signal is outputted from the inverter IV6 of the latch R. Then, a high signal is applied to the gate of the NMOS transistor N4 connected in series to the NMOS transistor N3, and the NMOS transistor N4 is turned-on.

Next, the chip enable transition detecting signal CTD is generated according to the chip enable signal CEB, and the transition synthesizing signal ATD_S is generated according to the chip enable transition detecting signal CTD.

When the address transition detecting signal ATD is enabled, the NMOS transistors N2 and N5 are turned on. Then, the ground voltage is applied to the gate of the NMOS transistor N4 connected in series to the NMOS transistor N3, and the NMOS transistor N4 is turned off.

As a result, the chip enable transition detecting signal CTD does not affect generation of the transition synthesizing signal ATD_S because the NMOS transistor N4 is turned off. However, the transition synthesizing signal ATD_S is generated according to the address transition detecting signal ATD. Here, the pull-up control signal PUPS controls pull-up operation of the transition synthesizing signal ATD_S.

When data is written in the FeRAM memory cell array or a program is performed, the write enable transition detecting signal WTD is enabled with a write control signal. Here, the NMOS transistor N1 is turned on when the write enable transition detecting signal WTD is enabled. As a result, the transition synthesizing signal ATD_S is generated according to the write enable transition detecting signal WTD regardless of the chip enable transition detecting signal CTD and the address transition detecting signal ATD.

Accordingly, a write operation can be performed at all write cycles, absolutely, according to the write enable transition detecting signal WTD regardless of variations of address, that is, the address transition detecting signal ATD, because the memory cell is normally operated in a write mode.

Figure 9:
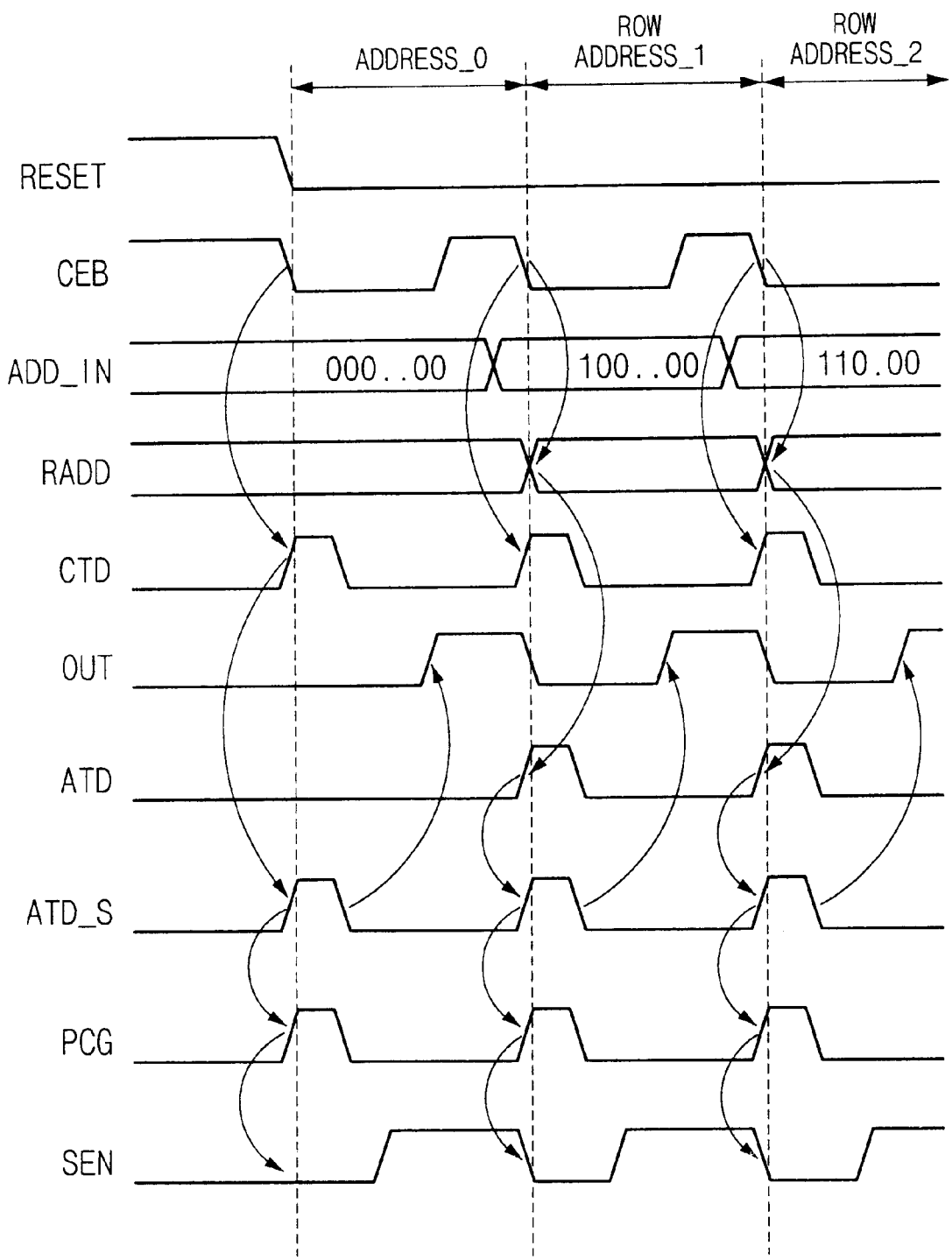
FIG. 9 is a timing diagram of a nonvolatile ferroelectric memory control device.

FIG. 9 is a timing diagram of a nonvolatile ferroelectric memory control device.

The operation of the memory cell is performed by generating an address transition detecting signal ATD only when a block selection address or a row address is transited. Hereinafter, an example is explained wherein the address transition detecting signal ATD is generated when a row address is transited.

Referring to FIG. 9, in each operation cycle, the operation is started when a chip enable signal CEB is transited from a high to low level.

First, a power-on reset signal RESET is transited from a high to low level. Next, a chip enable signal CEB is transited from a high to low level when a first address_0 is accessed.

Here, the address transition detecting signal ATD is not generated because an initially reset row address ADD_IN (000..00) is used at the access of the first address_0 after the power-on reset. As a result, a latched row address RADD is not transited before the interval of a second row address_1.

Next, a chip enable transition detecting signal CTD is generated at a low edge of the chip enable signal CEB. A memory cell operation signal OUT is generated by a transition synthesizing signal ATD_S generated according to the chip enable transition detecting signal CTD.

In other words, an address transition detecting signal ATD is not generated because a row address is not changed when the first address_0 is accessed. Then, the memory cell operation signal OUT for chip operation is generated from the first chip enable transition detecting signal CTD generated by the chip enable signal CEB.

Here, a precharge signal PCG is enabled. Until the precharge signal PCG is disabled, a sense amplifier enable signal SEN is held at a low level, and then enabled again.

When a second address_1 is accessed, an inputted row address ADD_IN(100..00) is different from the previous row address ADD_IN(000.00) in address. As a result, the latched row address RADD is transited when the second address_1 is accessed, and then generates an address transition detecting signal ATD.

The synthesizer 13 generates a transition synthesizing signal ATD_S by the address transition detecting signal ATD. The chip control signal generator 11 outputs the memory cell operation signal OUT for controlling chip driving according to the transition synthesizing signal ATD_S.

In other words, generation of the chip enable transition detecting signal CTD does not affect generation of the transition synthesizing signal ATD_S after the second address_1 is accessed. However, the transition synthesizing signal ATD_S is generated only by the address transition detecting signal ATD.

Here, driving of the sense amplifier and output of FeRAM memory data are generated only by the transition synthesizing signal ATD_S. When the transition synthesizing signal ATD_S is generated, the precharge signal PCG is enabled. Until the precharge signal PCG is disabled, the sense amplifier enable signal SEN is held at a low level, and then enabled again.

Figure 10:
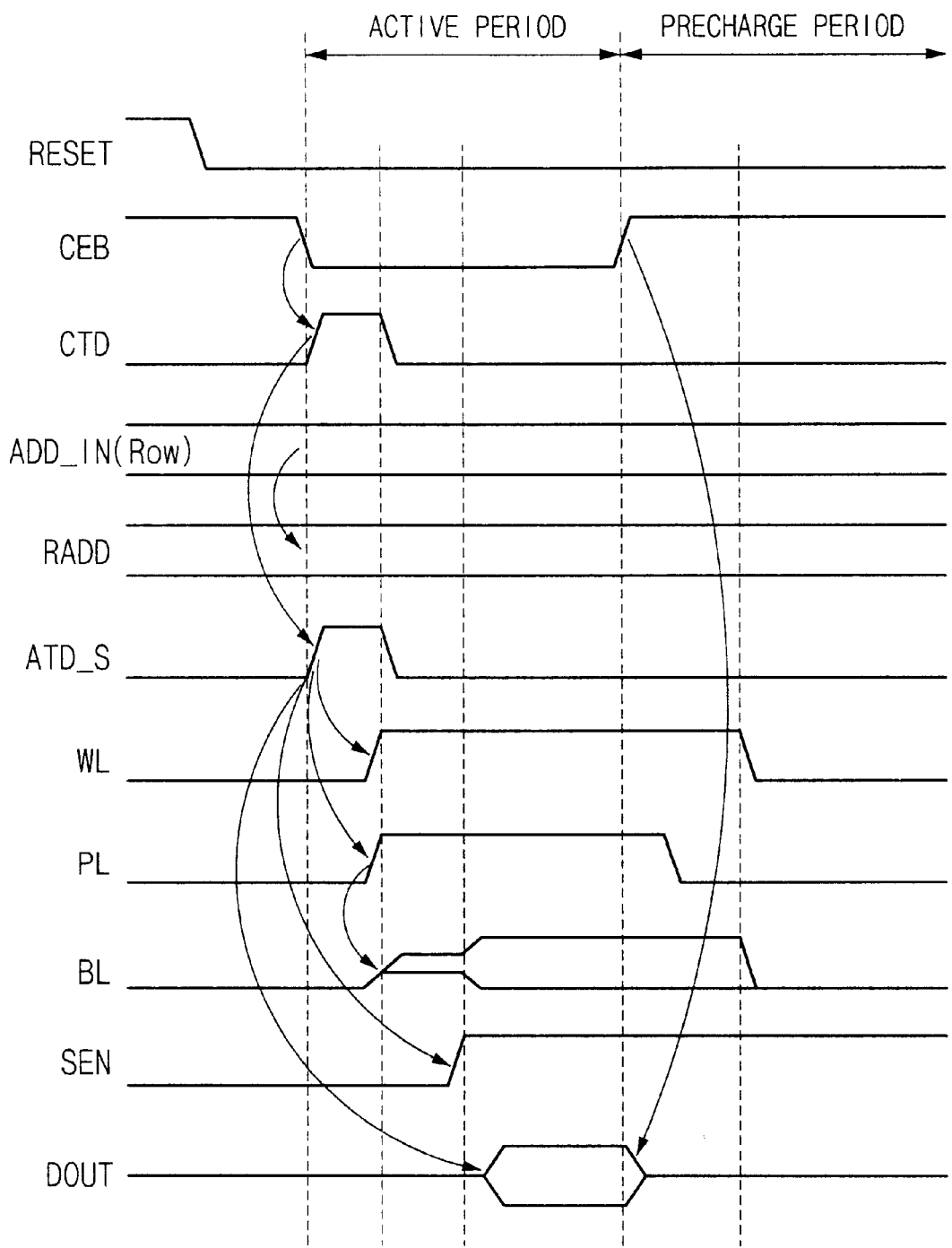
FIGS. 10 to 12 are timing diagrams at an access of a nonvolatile ferroelectric memory control device according to the present invention.

FIG. 10 is a timing diagram of a FRAM memory control signal at the access to the first address after the power-on reset according to the present invention.

First, if the power-on reset signal RESET is inputted and then entered in an active region when the first address is accessed, the chip enable signal CEB is transited to a low level, and then the operation is started. Here, the address transition detecting signal ATD is not generated because the row address ADD_IN and the latched row address RADD are not changed at the access of the first address.

When the chip enable signal CEB is transited to a low level, the chip enable transition detecting signal CTD is enabled to a high level. As a result, the transition synthesizing signal ATD_S corresponding to the first inputted chip enable transition detecting signal CTD is generated. According to the transition synthesizing signal ATD_S, the wordline WL, the plateline PL and the bitline BL for driving the memory cell are activated.

If the sense amplifier enable signal SEN is enabled after charge distribution of the bitline BL, output data DOUT is outputted. Here, it is shown that the output data DOUT is outputted in an interval where the chip enable signal CEB is enabled to a low level and precharged in an interval where the chip enable signal CEB is enabled to a high level. The sense amplifier enable signal SEN is held in an active state before the next address transition detecting signal ATD is generated.

Figure 11:
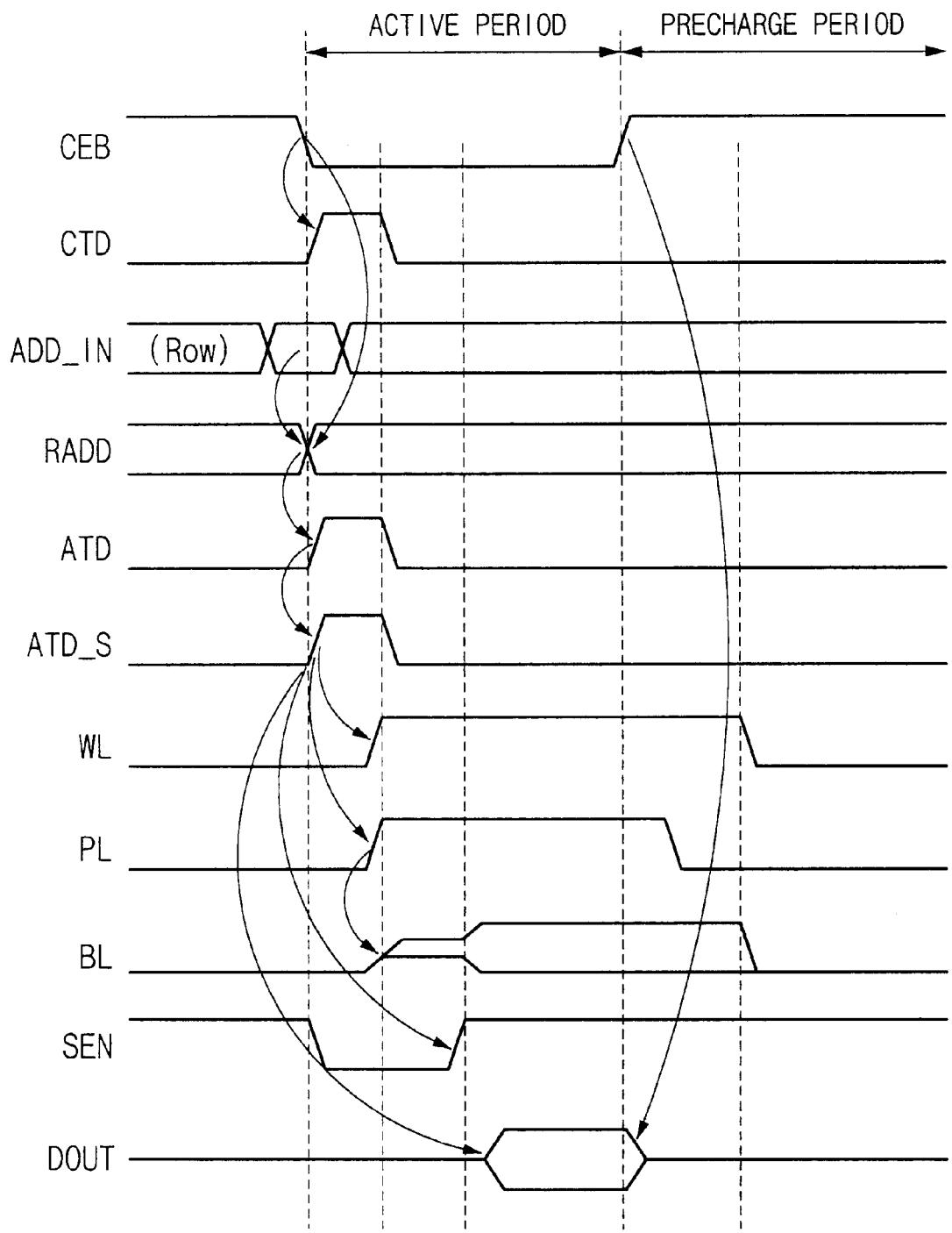

FIG. 11 is a timing diagram of a FRAM memory control signal at the access to the second and the third addresses when the chip enable transition detecting signal CTD and the address transition detecting signal ATD are generated.

First, when entered into an active region at the access of the second address, the chip enable signal CEB is transited to a low level and the operation is started.

If the chip enable signal CEB is transited to a low level, the chip enable transition detecting signal CTD is enabled to a high level. However, the chip enable transition detecting signal CTD does not affect generation of the transition synthesizing signal ATD_S at the access of the second address.

When the chip enable signal CEB is transited to a low level and the latched row address RADD is transited by transition of the row address ADD_IN, the address transition detecting unit 12 generates the address transition detecting signal ATD.

As a result, the transition synthesizing signal ATD_S is generated, and then the wordline WL, the plateline PL and the bitline BL for driving the memory cell are activated according to the transition synthesizing signal ATD_S.

When the sense amplifier enable signal SEN is enabled after charge distribution of the bitline, output data DOUT is outputted. The output data DOUT is outputted in an interval where the chip enable signal CEB is enabled to a low level and precharged in an interval where the chip enable signal CEB is at a high level.

The sense amplifier is enabled regardless of variation of cycle before the next address transition detecting signal ATD and the chip enable transition detecting signal CTD are generated by the sense amplifier enable signal SEN.

In other words, the sense amplifier is held in an active region in order to continuously store data during the previous address operation before the next address transition detecting signal ATD and the chip enable transition detecting signal CTD are generated to start cell operation.

Figure 12:
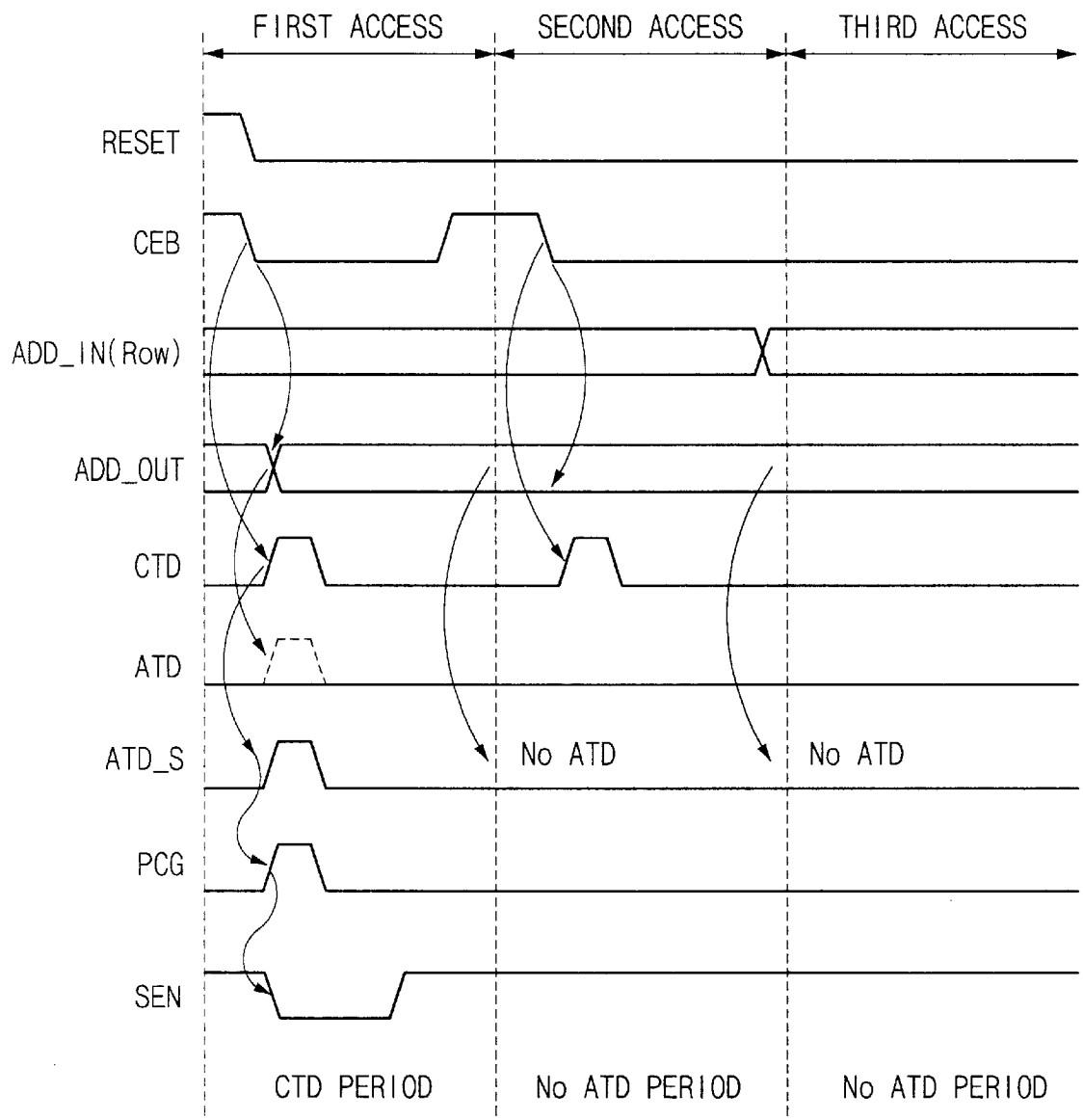

FIG. 12 a timing diagram of a FRAM memory control signal at the access to the second and the third addresses when the address transition detecting signal ATD is not generated.

First, the chip enable transition detecting signal CTD is generated by the chip enable signal CEB in the access interval of the first address.

The transition synthesizing signal ATD_S is generated by the chip enable transition detecting signal CTD, and then the sense amplifier enable signal SEN is disabled. Here, the chip enable transition detecting signal CTD is generated according to transition of the chip enable signal CEB, and the transition synthesizing signal ATD_S is generated. However, the row address ADD_IN is not transited, and the address transition detecting signal ATD is not generated.

The sense amplifier enable signal SEN is held at a low level state when the precharge signal PCG is generated, and maintained in an active state when the chip enable signal CEB is enabled.

In the access interval of the second address, the chip enable signal CEB is transited to a low level and the chip enable transition detecting signal CTD is enabled to a high level. However, the address transition detecting signal ATD is not affected by the chip enable transition detecting signal CTD.

Accordingly, the address transition detecting signal ATD and the transition synthesizing signal ATD_S are not generated when the input ted row address ADD_IN is not changed. However, the sense amplifier enable signal SEN is held in an active state before the next address transition detecting signal ATD is genrated.

Figure 13:
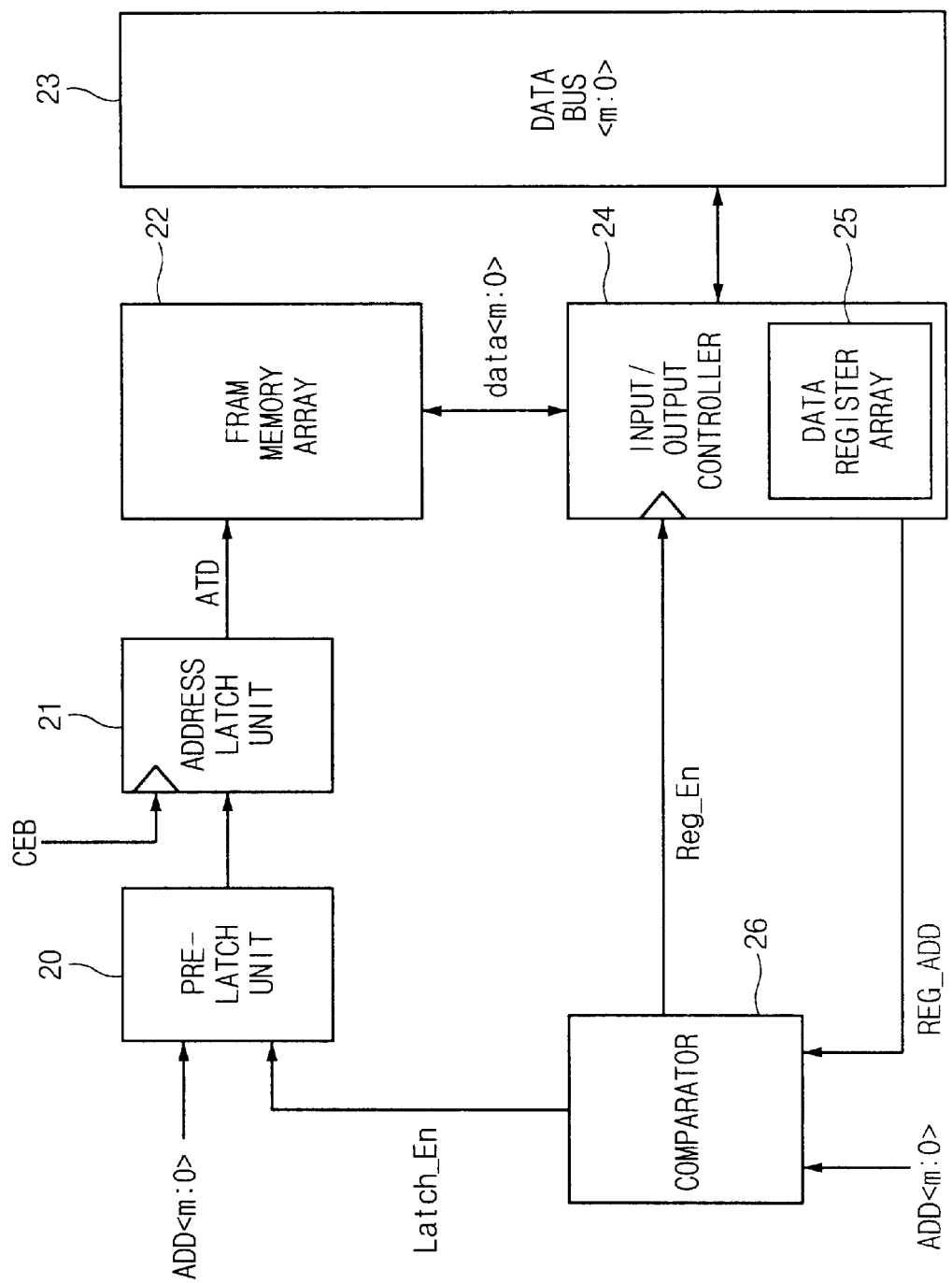
FIG. 13 is a structural diagram showing a nonvolatile ferroelectric memory control device in accordance with another preferred embodiment of the present invention.

FIG. 13 is a structural diagram showing a nonvolatile ferroelectric memory control device in accordance with another preferred embodiment of the present invention.

The nonvolatile ferroelectric memory control device comprises a pre-latch unit 20, an address latch unit 21, a FRAM memory array 22, a data bus 23, an input/output controller 24, a data register array 25 and a comparator 26.

The pre-latch unit 20 latches a row address ADD<m:0> inputted according to a latch enable signal Latch_En outputted from the comparator 26.

The address latch unit 21 latches output of the pre-latch unit 20 according to a chip enable signal CEB, and then outputs an address transition detecting signal ATD.

The FRAM memory array 22 controls its operation according to the address transition detecting signal ATD applied from the address latch unit 21.

The input/output controller 24 controls input/output of data<m:0>. The data register array 25 stores a row address data and a partial row address data applied from the FRAM memory array 22.

The comparator 26 compares the inputted row address ADD<m:0> with a register address REG_ADD previously stored in the data register array 25, and outputs the latch enable signal Latch_En or a register enable signal Reg_En according to the comparison result.

The operation process of the nonvolatile ferroelectric memory control device is as follows.

First, a partial row address of the FRAM memory array 22 and row address data is stored in the data register array 25 by the input/output controller 24.

The comparator 26 compares the inputted row address ADD<m:0> with the register address REG_ADD applied from the data register array 25 by the input/output controller 24.

When the register address REG_ADD is identical with the inputted row address ADD<m:0>, the comparator 26 outputs the register enable signal Reg_En into the data register array 25 where data currently accessed via the input/output controller 24 is stored. As a result, the data register array 25 immediately outputs data stored in the data register via the input/output controller 24 into the data bus 23.

On the contrary, when the register address REG_ADD is different from the inputted row address ADD<m:0>, the comparator 26 judges that data currently accessed is not stored in the data register array 25.

As a result, the latch enable signal Latch_En is outputted into the pre-latch unit 20, and a new address is outputted by the pre-latch unit 20. The address outputted from the pre-latch unit 20 is a changed row address which is newly inputted. The address transition detecting signal ATD is generated from the address latch unit 21 to control the operation of the FRAM memory array 22.

As described above, the preferred embodiment of FIG. 13 comprises the data register array 25 in the outside of the FRAM memory array 22. The detailed explanations of the structure and operation process are omitted because they are identical with those of above-described preferred embodiment.

As discussed earlier, the nonvolatile ferroelectric memory control device of the present invention can reduce power consumption of the whole chip operation by performing local cell operations to column addresses and the predetermined number of block/row addresses and improve its life by decreasing power stress applied to fram cells.

What is claimed is:

1. A nonvolatile ferroelectric memory control device comprising:
    a column address latch for latching column addresses according to a chip enable signals;
    a column decoder for decoding the latched column addresses;
    a chip enable signal transition detector for detecting whether the chip enable signals are transited, and then outputting a chip enable transition detecting signals;
    a row address latch for latching row addresses according to the chip enable signals;
    an address transition detector for detecting the latched row addresses are transited, and then outputting a address transition detecting signals;
    a synthesizer for outputting the transition synthesizing signals according to input of the chip enable transition detecting signals when a power-on reset signals are inputted and then outputting the transition synthesizing signals according to the address transition detecting signals; and
    a chip control signal generator for outputting control signals controlling chip operation according to the transition synthesizing signals.

2. The device according to claim 1, wherein the row address is arranged in the most significant bit area and the column address is arranged in the least significant bit area.

3. The device according to claim 1, wherein the row address latch comprises:
    a flip-flop for latching the row address at a low edge of the chip enable signal; and
    a delay means for delaying an output signal of the flip-flop and then outputting the latched row address.

4. The device according to claim 1, wherein the address transition detector does not generate the address transition detecting signal when an inputted row address is equal to the previously stored row address while generating the address transition detecting signal when an inputted row address is different from the previously stored row address.

5. The device according to claim 1, wherein the synthesizer outputs the transition synthesizing signal by synthesizing the power-on reset signal, the chip enable transition detecting signal, the address transition detecting signal and the write enable transition detecting signal when a pull-up control signal is applied.

6. The device according to claim 5, wherein the synthesizer generates the transition synthesizing signal by using the chip enable transition detecting signal first generated after the power-on reset signal is enabled, and then generates the transition synthesizing signal by the address transition detecting signal.

7. The device according to claim 5, wherein the synthesizer activates the transition synthesizing signal according to yes or no of enable of the write enable transition detecting signals detecting whether a write control signal is transited, regardless of the chip enable transition detecting signal and the address transition detecting signal, during write/program operation of the memory cell array.

8. The device according to claim 7, wherein the synthesizer comprises:
    a pull-up driver connected between a power voltage terminal and an output terminal of the transition synthesizing signal and having a gate whereto the pull-up control signal is applied;
    a first driver connected between the output terminal of the transition synthesizing signal and a ground voltage terminal and having a gate whereto the write enable transition detecting signal is applied;
    a second driver connected between the output terminal of the transition synthesizing signal and the ground voltage terminal and having a gate whereto the address transition detecting signal is applied;

a latch for latching and the power-on reset signal;

a third driver connected between the latch and the ground voltage terminal and having a gate whereto the power-on reset signal is applied;

a fourth driver connected between the latch and the ground voltage terminal and having a gate whereto the address transition detecting signal is applied; and fifth and sixth drivers connected between an output terminal of the transition synthesizing signal and the ground voltage terminal and having their gates whereto the chip enable transition detecting signal and an output signal of the latch are applied, respectively.

9. The device according to claim 1, wherein data stored in a sense amplifier is outputted when the column address is accessed in the same row address.

10. The device according to claim 9, wherein the sense amplifier outputs the previous data, maintained at an activation state when the chip enable transition detecting signal and the address transition detecting signal by transition detection of the row address are not generated.

11. A nonvolatile ferroelectric memory control device comprising:

a column address latch for latching column addresses according to a chip enable signals;

a column decoder for decoding the latched column address;

a chip enable signal transition detector for detecting whether the chip enable signal is transited and then outputting a chip enable transition detecting signals;

a block selection address latch for latching block selection addresses according to the chip enable signals;

an address transition detector for detecting whether the latched block selection address is transited and then outputting a address transition detecting signals;

a synthesizer for outputting the transition synthesizing signal according to input of the chip enable transition detecting signal when a power-on reset signal is inputted and then outputting the transition synthesizing signal according to the address transition detecting signal; and a chip control signal generator for outputting control signals controlling chip operation according to the transition synthesizing signal.

12. The device according to claim 11, wherein the block selection address is arranged in the most significant bit area and the column address is arranged in the least significant bit area.

13. The device according to claim 11, wherein the block selection address latch comprises:

a flip-flop for latching the row address at a low edge of the chip enable signal; and a delay means for delaying an output signal of the flip-flop and then outputting the latched row address.

14. The device according to claim 11, wherein the address transition detector does not generate the address transition detecting signal when an inputted row address is equal to the previously stored row address while generating the address transition detecting signal when an inputted row address is different from the previously stored row address.

15. The device according to claim 11, wherein the synthesizer outputs the transition synthesizing signal by synthesizing the power-on reset signal, the chip enable transition detecting signal, the address transition detecting signal and the write enable transition detecting signal when a pull-up control signal is applied.

16. The device according to claim 15, wherein the synthesizer activates the transition synthesizing signal according to yes or no of enable of the write enable transition detecting signals detecting whether a write control signal is transited, regardless of the chip enable transition detecting signal and the address transition detecting signal, during write/program operation of the memory cell array.

17. The device according to claim 16, wherein the synthesizer comprises:

a pull-up driver connected between a power voltage terminal and an output terminal of the transition synthesizing signal and having a gate whereto the pull-up control signal is applied;

a first driver connected between the output terminal of the transition synthesizing signal and a ground voltage terminal and having a gate whereto the write enable transition detecting signal is applied;

a second driver connected between the output terminal of the transition synthesizing signal and the ground voltage terminal and having a gate whereto the address transition detecting signal is applied;

a latch for latching the power-on reset signal;

a third driver connected between the latch and the ground voltage terminal and having a gate whereto the power-on reset signal is applied;

a fourth driver connected between the latch and the ground voltage terminal and having a gate whereto the address transition detecting signal is applied; and fifth and sixth drivers connected between the output terminal of the transition synthesizing signal and the ground voltage terminal and having their gates whereto the chip enable transition detecting signal and an output signal of the latch are applied, respectively.

18. The device according to claim 11, wherein the synthesizer generates the transition synthesizing signal by the chip enable transition detecting signal first generated after the power-on reset signal is enabled and then generates the transition synthesizing signal by the address transition detecting signal.

19. The device according to claim 11, wherein data stored in a sense amplifier is outputted when the column address is accessed in the same row address.

20. The device according to claim 11, wherein the sense amplifier outputs the previous data, maintained at an activation state when the chip enable transition detecting signal and the address transition detecting signal by transition detection of the row address are not generated.

21. A nonvolatile ferroelectric memory control device comprising:

a pre-latch unit for latching row addresses inputted according to a latch enable signals;

an address latch unit for latching outputs of the pre-latch unit according to chip enable signals and outputting a address transition detecting signals;

a FRAM memory array wherein its driving is controlled according to the address transition detecting signal applied from the address latch unit;

a data register array for storing the row address and the row address data applied from the FRAM memory array;

a comparator for comparing row addresses stored in the data register array and the inputted row addresses and then outputting the latch enable signals or a register enable signals according to the comparison result; and an input/output controller for controlling data input/output of the FRAM memory array and outputting the row address data stored in the data register array according to the register enable signals into data buses.

22. The device according to claim 21, wherein the comparator compares the stored row address with the row address, and outputs the register enable signals when the two addresses are identical but the latch enable signal when the two addresses are different.

23. A nonvolatile ferroelectric memory control device controlling operations of the memory cells according to transition of input addresses, activating a sense amplifier and a data register where corresponding address data is stored regardless of chip enable signal in order that data may be normally inputted/outputted when the memory cell is not operated, wherein data stored in the sense amplifier or the data register is immediately inputted/outputted when the data is inputted/outputted.

24. The device according to claim 23, wherein the input address is at least one of a row address and a block selection address.

25. The device according to claim 23, wherein the sense amplifier is maintained at an activation state regardless of variation of operation cycle of the memory cell before a transition detecting signal of the next address and a chip enable transition detecting signal are generated.

* * * * *